United States Patent
Zeng et al.

(10) Patent No.: US 12,295,153 B2
(45) Date of Patent: May 6, 2025

(54) METHOD FOR MANUFACTURING METAL GATE OF PMOS

(71) Applicant: Shanghai Huali Integrated Circuit Corporation, Shanghai (CN)

(72) Inventors: Zhaoqin Zeng, Shanghai (CN); Yu Zhang, Shanghai (CN); Jingxun Fang, Shanghai (CN); Yu Bao, Shanghai (CN); Jianhua Xu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 495 days.

(21) Appl. No.: 17/945,356

(22) Filed: Sep. 15, 2022

(65) Prior Publication Data
US 2023/0132408 A1   May 4, 2023

(30) Foreign Application Priority Data
Oct. 29, 2021   (CN) .......................... 202111268267.5

(51) Int. Cl.
 *H10D 30/01*   (2025.01)
 *H10D 64/01*   (2025.01)
(52) U.S. Cl.
 CPC ....... *H10D 30/0516* (2025.01); *H10D 64/017* (2025.01)

(58) Field of Classification Search
 CPC .......................... H10D 30/0516; H10D 64/017
 See application file for complete search history.

(56) References Cited

U.S. PATENT DOCUMENTS

| | | | |
|---|---|---|---|
| 2013/0056836 A1* | 3/2013 | Yu ...................... | H10D 84/0177 257/E21.409 |
| 2015/0214112 A1* | 7/2015 | Zhao .................. | H10D 30/0225 257/369 |
| 2023/0109915 A1* | 4/2023 | Chen ..................... | H10D 64/01 257/288 |

* cited by examiner

*Primary Examiner* — Christine A Enad
(74) *Attorney, Agent, or Firm* — Banner & Witcoff, Ltd.

(57) ABSTRACT

The present application discloses a method for manufacturing a metal gate of a PMOS, comprising: step 1, forming a P-type work function metal layer; step 2, depositing an N-type work function metal layer by means of a PVD process, wherein over a bottom surface of a gate trench, the N-type work function metal layer has a hill profile; step 3, forming a first top barrier metal sublayer by means of a conformal growth process, wherein the first top barrier metal sublayer completely fills a sharp corner area of the N-type work function metal layer at a corner of the gate trench; step 4, growing a second top barrier metal sublayer by means of a PVD bombardment process; step 5, forming a third top barrier metal sublayer and a fourth top barrier metal sublayer; and step 6, forming a metal conductive material layer.

16 Claims, 4 Drawing Sheets

METHOD FOR MANUFACTURING METAL GATE OF PMOS

CROSS-REFERENCE TO RELATED APPLICATIONS

This application claims the priority to Chinese Patent Application No. 202111268267.5, filed on Oct. 29, 2021, the disclosure of which is incorporated herein by reference in its entirety.

TECHNICAL FIELD

The present application relates to a method for manufacturing a semiconductor integrated circuit, in particular to a method for manufacturing a metal gate (MG) of a PMOS.

BACKGROUND

Regarding the CMOS of the 28 nm/22 nm technology node, the high-k and metal gate last technology is widely applied in CMOS devices, mainly for the purpose of avoiding a damage to the device caused by high temperature processing and reducing the equivalent oxide thickness (EOT) of a gate dielectric layer of the CMOS device.

In the current high-K dielectric layer/metal gate last technology, a metal conductive material layer of the metal gate is usually made of aluminum. However, aluminum diffusion has always been one of the major problems affecting the reliability and performance of the device, imposing adverse impacts on the reliability indexes such as time-dependent dielectric breakdown (TDDB), negative-bias temperature instability (NBTI), and positive-bias temperature instability (PBTI). In addition, the aluminum diffusion also affects the carrier mobility, thereby reducing the performance of the device.

Generally, an N-type work function (NWF) metal layer is composed of TiAl deposited by means of physical vapor deposition (PVD), and presents a hill profile at the bottom of a gate trench. In this case, the aluminum in the metal gate is prone to diffusing downwards from the corner of the sidewall of the gate trench and penetrating into a P-type work function (PWF) metal layer, resulting in continuous degradation of the reliability and performance of the device. Therefore, it is necessary to propose a novel manufacturing method to solve the defects in the prior art. Details are provided herein with reference to FIG. 1.

FIG. 1 is a schematic diagram of a device structure obtained after a top barrier metal layer is formed in an existing method for manufacturing a metal gate of a PMOS. The existing method for manufacturing a metal gate of a PMOS includes the following steps.

Step 1. A P-type work function metal layer 106 is formed, the P-type work function metal layer 106 being formed on a bottom surface and a side surface of a gate trench 103.

Generally, the material of the P-type work function metal layer 106 includes TiN.

The gate trench 103 is formed by removing a dummy polysilicon gate (dummy poly). That is, the existing method adopts a metal gate last process. Before the formation of the metal gate, it is necessary to form the dummy polysilicon gate on a semiconductor substrate 101, then form source and drain areas of the PMOS in self-aligned definition of the polysilicon dummy gate, and perform annealing and activation of the source and drain areas. A spacer is usually formed on the side surface of the dummy polysilicon gate. A zeroth interlayer film 102 is formed lastly, and the zeroth interlayer film 102 is planarized such that the top surfaces of the zeroth interlayer film 102 and the dummy polysilicon gate are flush with each other. The dummy polysilicon gate is then removed, and the gate trench 103 is formed in an area where the dummy polysilicon gate is removed.

A gate dielectric layer 104 and a bottom barrier metal (BBM) layer 105 are formed between the bottom of the P-type work function metal layer 106 and the surface of the semiconductor substrate 101.

The gate dielectric layer 104 includes an interface layer and a high dielectric constant layer that are stacked in sequence.

The bottom barrier metal layer 105 is composed of a TiN layer 105a and a TaN layer 105b that are stacked.

Step 2. An N-type work function metal layer 107 is deposited by means of a PVD process, the N-type work function metal layer 107 being formed on the surface of the P-type work function metal layer 106, wherein over the bottom surface of the gate trench 103, the N-type work function metal layer 107 has a hill profile composed of a thicker portion located at a middle area of the gate trench 103 and a thinner portion located at the side surface of the gate trench 103, and the hill profile enables the N-type work function metal layer 107 to have a sharp corner less than 90 degrees at a corner of the gate trench 103, an area shown by the dashed line circle 107a being an included angle area.

Generally, the material of the N-type work function metal layer 107 includes TiAl.

Step 3. A top barrier metal (TBM) layer 108 composed of a TiN layer and a Ti layer that are stacked is formed by means of a PVD process.

Step 4. A metal conductive material layer is formed to completely fill the gate trench 103. Usually, the material of the metal conductive material layer 109 is Al.

In FIG. 1, the N-type work function metal layer 107 of an NMOS is present in the metal gate of the PMOS, as the PMOS and NMOS are usually both integrated on the same semiconductor substrate 101. In the industry, there are roughly two methods for integrating the PMOS and NMOS in the high-k and metal gate last manufacturing process. The first method is simultaneously etching the dummy polies of the PMOS and NMOS, and the second method is separately etching the dummy polies of the PMOS and NMOS. The advantage of the first method is a small number of processes. The existing method corresponding to FIG. 1 is the first method. However, in this method, referring to FIG. 2, since the gate trench 103 of the PMOS is filled with an extra TiAl film of about 80 Å-120 Å, i.e. the N-type work function metal layer 107, a top opening of the gate trench 103 is sacrificed, thus reducing the hole filling performance of Al. Therefore, the top barrier metal layer 108 of Al cannot be excessively thick, resulting in a small process window for blocking Al diffusion and thereby leading to a poor effect of blocking the aluminum diffusion of the metal gate. Referring to FIG. 1, usually, the N-type work function metal layer 107 is composed of TiAl deposited by means of PVD, and presents a hill profile at the bottom of the gate trench 103. In this case, the aluminum in the metal gate is prone to diffusing downwards from the corner of the sidewall of the gate trench 103, i.e., the position indicated by the dashed line circle 107a, and penetrating into the P-type work function metal layer 106, resulting in continuous degradation of the reliability and performance of the device.

BRIEF SUMMARY

The present application is to provide a method for manufacturing a metal gate of a PMOS, so as to enhance blocking capability of a top barrier metal layer at a bottom corner of a gate trench and reduce metal material diffusion of a metal conductive material layer of the metal gate.

According to some embodiments in this application, the method for manufacturing a metal gate of a PMOS provided by the present application includes the following steps:

step 1, forming a P-type work function metal layer, the P-type work function metal layer being formed on a bottom surface and a side surface of a gate trench;

step 2, depositing an N-type work function metal layer by means of a PVD process, the N-type work function metal layer being formed on the surface of the P-type work function metal layer, wherein over the bottom surface of the gate trench, the N-type work function metal layer has a hill profile composed of a thicker portion located at a middle area of the gate trench and a thinner portion located at the side surface of the gate trench, and the hill profile enables the N-type work function metal layer to have a sharp corner less than 90 degrees at a corner of the gate trench;

step 3, forming a first top barrier metal sublayer on the surface of the N-type work function metal layer by means of a conformal growth process, wherein due to properties of the conformal growth, the first top barrier metal sublayer completely fills a sharp corner area of the N-type work function metal layer at the corner of the gate trench;

step 4, growing a second top barrier metal sublayer by means of a PVD bombardment process, wherein the PVD bombardment process increases a vertical bias while grows the second top barrier metal sublayer, so as to achieve vertical bombardment on the first top barrier metal sublayer and the second top barrier metal sublayer, increasing atomic density of the first top barrier metal sublayer and causing sputtering of materials of the first top barrier metal sublayer and the second top barrier metal sublayer that are deposited at the middle area on the bottom surface of the gate trench to the corner of the gate trench, thereby increasing the thickness of a stack layer of the first top barrier metal sublayer and the second top barrier metal sublayer at the corner of the gate trench and making an opening profile of the second top barrier metal sublayer in the gate trench U-shaped;

step 5, sequentially forming a third top barrier metal sublayer and a fourth top barrier metal sublayer by means of a PVD process, wherein the first top barrier metal sublayer, the second top barrier metal sublayer, the third top barrier metal sublayer, and the fourth top barrier metal sublayer are stacked to form a top barrier metal layer; and step 6, forming a metal conductive material layer to completely fill the gate trench.

In some cases, in step 2, the material of the N-type work function metal layer includes TiAl.

In some cases, in step 3, the material of the first top barrier metal sublayer includes TiN or TaN.

In some cases, in step 3, the conformal growth process of the first top barrier metal sublayer is an atomic layer deposition (ALD) process.

In some cases, in step 4, the material of the second top barrier metal sublayer includes Ti.

In some cases, in step 4, the vertical bias of the PVD bombardment process is 500 w-1200 w.

In some cases, in step 5, the material of the third top barrier metal sublayer includes TiN.

In some cases, in step 5, the material of the fourth top barrier metal sublayer includes Ti.

In some cases, the material of the metal conductive material layer includes Al.

In some cases, the thickness of the first top barrier metal sublayer is 10 Å-30 Å.

In some cases, the thickness of the second top barrier metal sublayer is 10 Å-30 Å.

In some cases, the thickness of the stack layer of the third top barrier metal sublayer and the fourth top barrier metal sublayer is 90 Å-130 Å.

In some cases, in step 1, the material of the P-type work function metal layer includes TiN.

In some cases, in step 1, the gate trench is formed by removing a dummy polysilicon gate.

In some cases, a gate dielectric layer and a bottom barrier metal layer are formed between the bottom of the P-type work function metal layer and the surface of a semiconductor substrate.

In some cases, the gate dielectric layer includes an interface layer and a high dielectric constant layer stacked in sequence.

In order to solve the sharp corner defect at the corner of the gate trench resulting from the hill profile of the N-type work function metal layer deposited by means of the PVD process over the bottom surface of the gate trench, in the present application, before the formation of the third top barrier metal sublayer and the fourth top barrier metal sublayer, the first top barrier metal sublayer is formed by means of the conformal growth process and the second top barrier metal sublayer is formed by means of the PVD bombardment process. Due to the properties of the conformal growth, the first top barrier metal sublayer can completely fill the sharp corner of the N-type work function metal layer formed at the bottom corner of the gate trench. On that basis, the vertical bombardment effect of the PVD bombardment process causes the sputtering of the materials of the first top barrier metal sublayer and the second top barrier metal sublayer at the middle area on the bottom surface of the gate trench to the corner of the gate trench, thereby making the opening profile of the second top barrier metal sublayer in the gate trench U-shaped. Such the U-shaped structure can prevent the finished top barrier metal layer from forming a sharp corner at the corner of the gate trench and presenting a relatively small thickness at the sharp corner. Therefore, the thickness of the top barrier metal layer at the corner of the gate trench can be increased, and the blocking capability of the top barrier metal layer at the bottom corner of the gate trench can be enhanced, reducing the metal material diffusion of the metal conductive material layer of the metal gate and thereby improving the problem caused by the metal material diffusion of the metal gate.

In addition, the PVD bombardment process of the present application can increase the atomic density of the first top barrier metal sublayer, enhancing the blocking capability of the first top barrier metal sublayer and thereby further enhancing the blocking capability of the top barrier metal layer.

BRIEF DESCRIPTION OF THE DRAWINGS

The present application is described in detail below with reference to the drawings and specific implementations.

DETAILED DESCRIPTION

Figure 1:
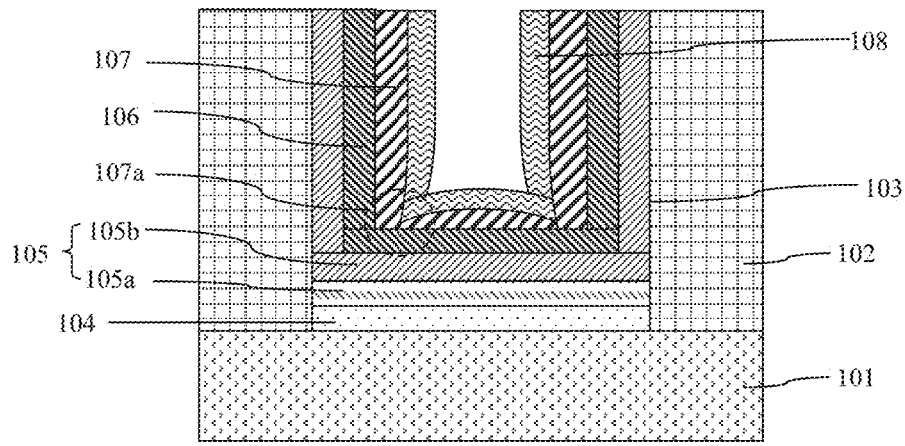
FIG. 1 is a schematic diagram of a device structure obtained after a top barrier metal layer is formed in an existing method for manufacturing a metal gate of a PMOS.
Figure 2:
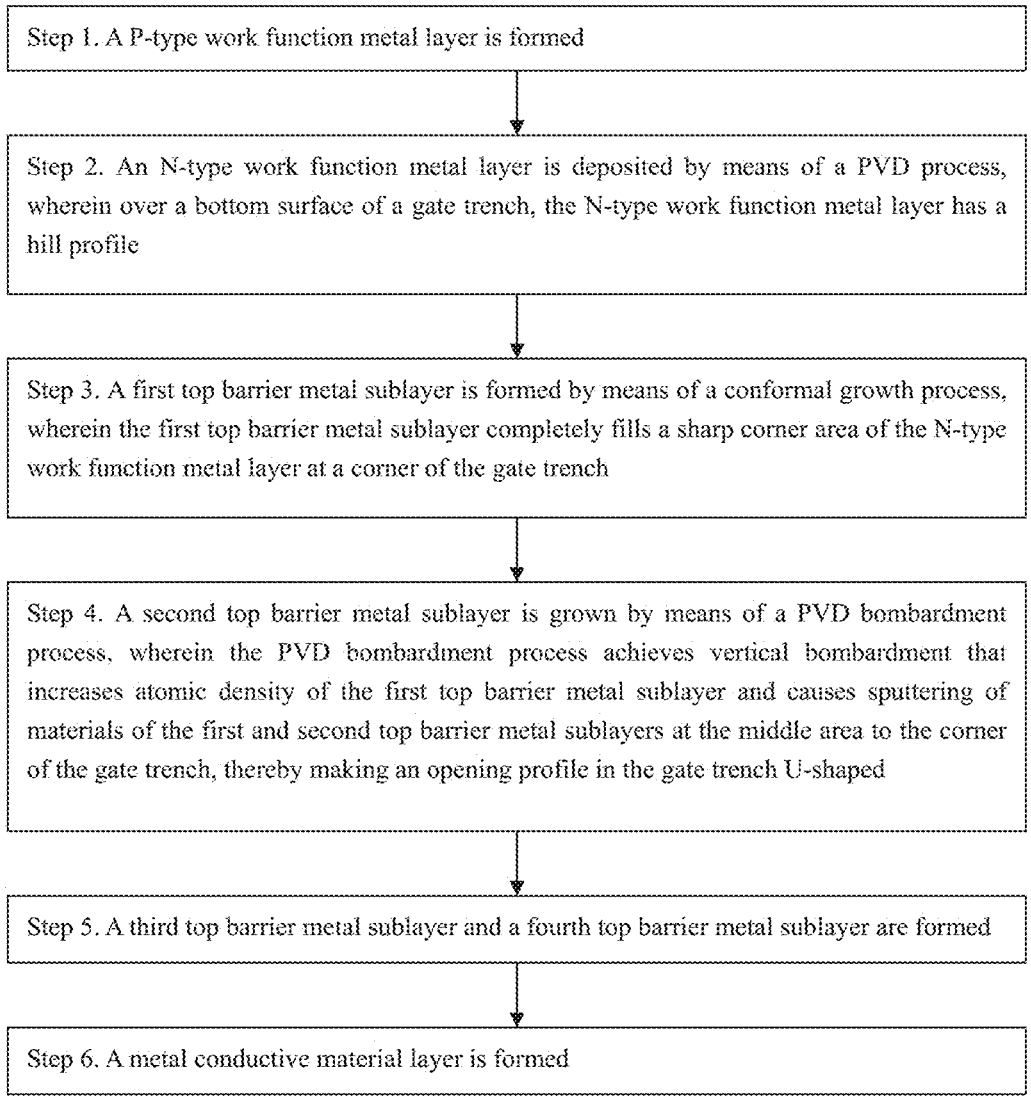
FIG. 2 is a flowchart of a method for manufacturing a metal gate of a PMOS according to an embodiment of the present application.

FIG. 2 is a flowchart of a method for manufacturing a metal gate of a PMOS according to an embodiment of the present application. FIGS. 3A-3E are schematic diagrams of device structures in steps of the method for manufacturing a metal gate of a PMOS according to an embodiment of the present application. The method for manufacturing a metal gate of a PMOS according to an embodiment of the present application includes the following steps.

Figure 3A:
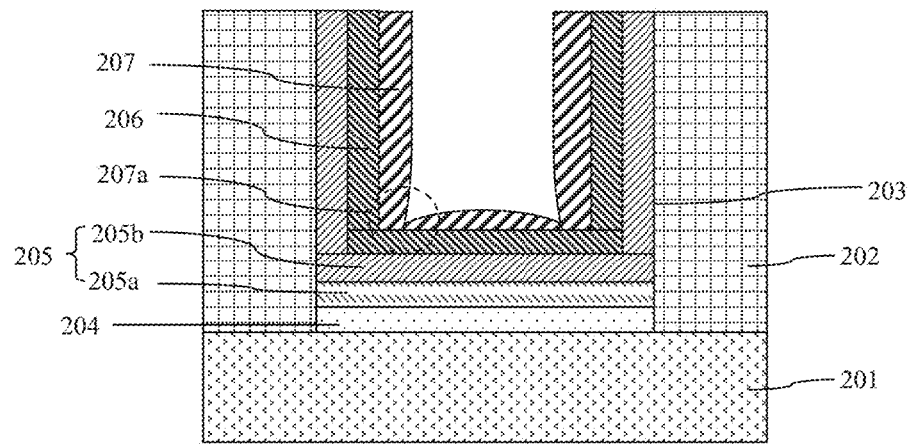
FIGS. 3A-3E are schematic diagrams of device structures in steps of the method for manufacturing a metal gate of a PMOS according to an embodiment of the present application.

Step 1. Referring to FIG. 3A, a P-type work function metal layer 206 is formed, the P-type work function metal layer 206 being formed on a bottom surface and a side surface of a gate trench 203.

In this embodiment of the present application, the material of the P-type work function metal layer 206 includes TiN.

The gate trench 203 is formed by removing a dummy polysilicon gate. That is, this embodiment of the present application adopts a metal gate last process. Before the formation of the metal gate, it is necessary to form the dummy polysilicon gate on a semiconductor substrate 201, then form source and drain areas of the PMOS in self-aligned definition of the polysilicon dummy gate, and perform annealing and activation of the source and drain areas. A spacer is usually formed on the side surface of the dummy polysilicon gate. A zeroth interlayer film 202 is formed lastly, and the zeroth interlayer film 202 is planarized such that the top surfaces of the zeroth interlayer film 202 and the dummy polysilicon gate are flush with each other. The dummy polysilicon gate is then removed, and the gate trench 203 is formed in an area where the dummy polysilicon gate is removed.

A gate dielectric layer 204 and a bottom barrier metal layer 205 are formed between the bottom of the P-type work function metal layer 206 and the surface of the semiconductor substrate 201.

The gate dielectric layer 204 includes an interface layer and a high dielectric constant layer that are stacked in sequence.

In this embodiment of the present application, the gate dielectric layer 204 can be formed by means of a high-K (HK) first process. In the process, the gate dielectric layer 204 is formed before the dummy polysilicon gate is formed, and remains at a bottom area of the gate trench 203 after the dummy polysilicon gate is removed.

In other embodiments, the gate dielectric layer 204 can be formed by means of a high-K (HK) last process. In the process, a dummy gate dielectric layer is formed between the dummy polysilicon gate and the semiconductor substrate 201, after the dummy polysilicon gate is removed, the dummy gate dielectric layer at the bottom of the gate trench 203 is also removed, and then the gate dielectric layer 204 is formed. In this process, the gate dielectric layer 204 is also formed on the side surface of the gate trench 203.

The bottom barrier metal layer 205 is composed of a TiN layer 205a and a TaN layer 205b that are stacked.

Step 2. Referring to FIG. 3A, an N-type work function metal layer 207 is deposited by means of a PVD process, the N-type work function metal layer 207 being formed on the surface of the P-type work function metal layer 206, wherein over the bottom surface of the gate trench 203, the N-type work function metal layer 207 has a hill profile composed of a thicker portion located at a middle area of the gate trench 203 and a thinner portion located at the side surface of the gate trench 203, and the hill profile enables the N-type work function metal layer 207 to have a sharp corner less than 90 degrees at a corner of the gate trench 203, an area shown by the dashed line circle 207a being an included angle area.

In this embodiment of the present application, the material of the N-type work function metal layer 207 includes TiAl.

Figure 3B:
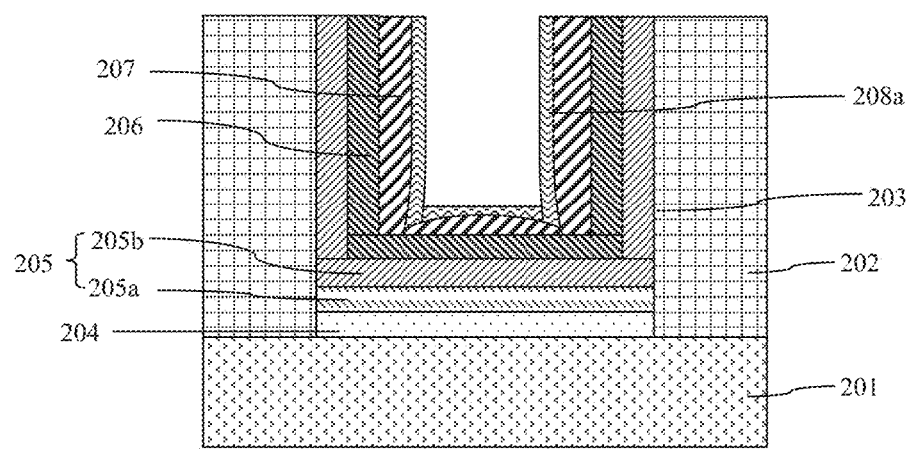

Step 3. Referring to FIG. 3B, a first top barrier metal sublayer 208a is formed on the surface of the N-type work function metal layer 207 by means of a conformal growth process, wherein due to properties of the conformal growth, the first top barrier metal sublayer 208a completely fills a sharp corner area of the N-type work function metal layer 207 at the corner of the gate trench 203.

In this embodiment of the present application, the material of the first top barrier metal sublayer 208a includes TiN or TaN.

The conformal growth process of the first top barrier metal sublayer 208a is an ALD process.

The thickness of the first top barrier metal sublayer 208a is 10 Å-30 Å.

Figure 3C:
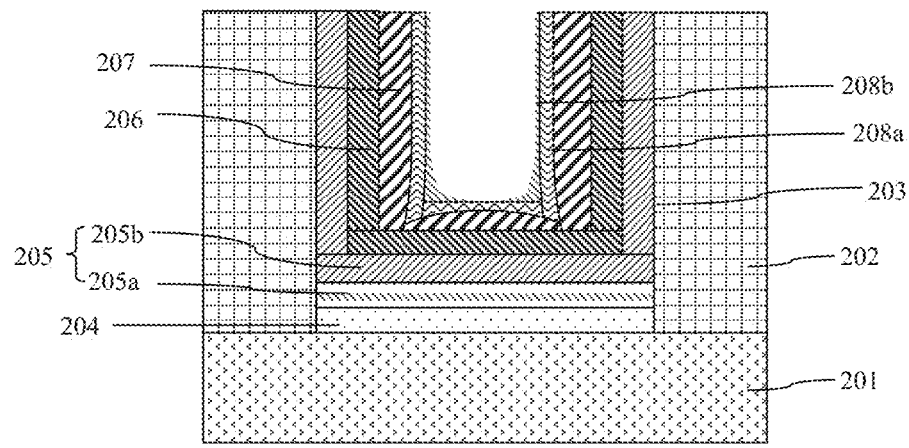

Step 4. Referring to FIG. 3C, a second top barrier metal sublayer 208b is grown by means of a PVD bombardment process, wherein the PVD bombardment process increases a vertical bias while grows the second top barrier metal sublayer 208b, so as to achieve vertical bombardment on the first top barrier metal sublayer 208a and the second top barrier metal sublayer 208b, increasing atomic density of the first top barrier metal sublayer 208a and causing sputtering of materials of the first top barrier metal sublayer 208a and the second top barrier metal sublayer 208b that are deposited at the middle area on the bottom surface of the gate trench 203 to the corner of the gate trench 203, thereby increasing the thickness of a stack layer of the first top barrier metal sublayer 208a and the second top barrier metal sublayer 208b at the corner of the gate trench 203 and making an opening profile of the second top barrier metal sublayer 208b in the gate trench 203 U-shaped.

In this embodiment of the present application, the material of the second top barrier metal sublayer 208b includes Ti.

The vertical bias of the PVD bombardment process is 500 w-1200 w.

The thickness of the second top barrier metal sublayer 208b is 10 Å-30 Å.

Figure 3D:
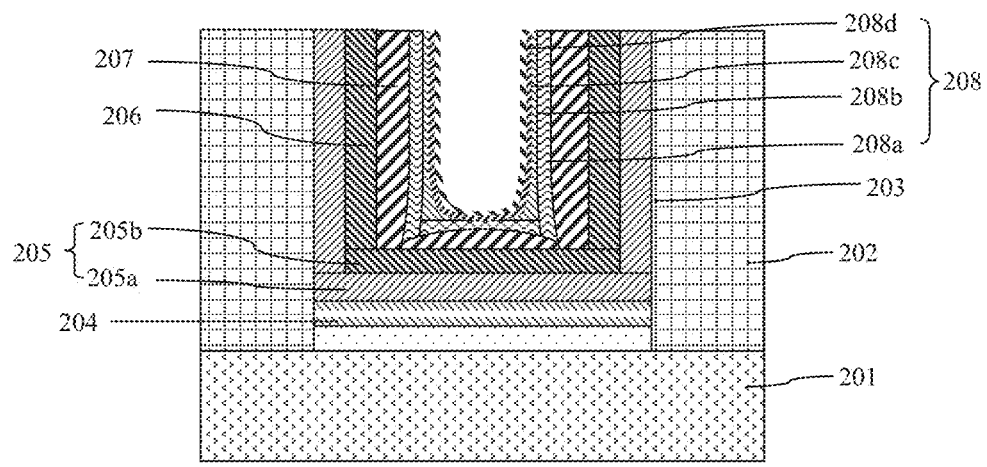

Step 5. Referring to FIG. 3D, a third top barrier metal sublayer 208c and a fourth top barrier metal sublayer 208d are sequentially formed by means of a PVD process, wherein the first top barrier metal sublayer 208a, the second top barrier metal sublayer 208b, the third top barrier metal sublayer 208c, and the fourth top barrier metal sublayer 208d are stacked to form a top barrier metal layer 208.

In this embodiment of the present application, the material of the third top barrier metal sublayer 208c includes TiN.

The material of the fourth top barrier metal sublayer 208d includes Ti.

The thickness of the stack layer of the third top barrier metal sublayer 208c and the fourth top barrier metal sublayer 208d is 90 Å-130 Å.

Compared with the existing method directly using a TiN layer and a Ti layer formed by means of a PVD process as a top barrier metal layer, similar to a method directly using the stack layer of the third top barrier metal sublayer 208c and the fourth top barrier metal sublayer 208d in this embodiment of the present application as the top barrier metal layer, the method of this embodiment of the present application can, under the condition that the thickness of the top barrier metal layer is kept the same as the thickness of the top barrier metal layer formed by the existing method, deduct a portion from the thickness of the stack layer of the third top barrier metal sublayer 208c and the fourth top barrier metal sublayer 208d and add the portion to the thickness of a stack layer of the first top barrier metal sublayer 208a and the second top barrier metal sublayer 208b. In this way, after the top barrier metal layer is formed, the size of an opening enclosed by the top barrier metal layer can remain unchanged, causing no adverse impact on subsequent filling of a metal conductive material layer 209.

Figure 3E:
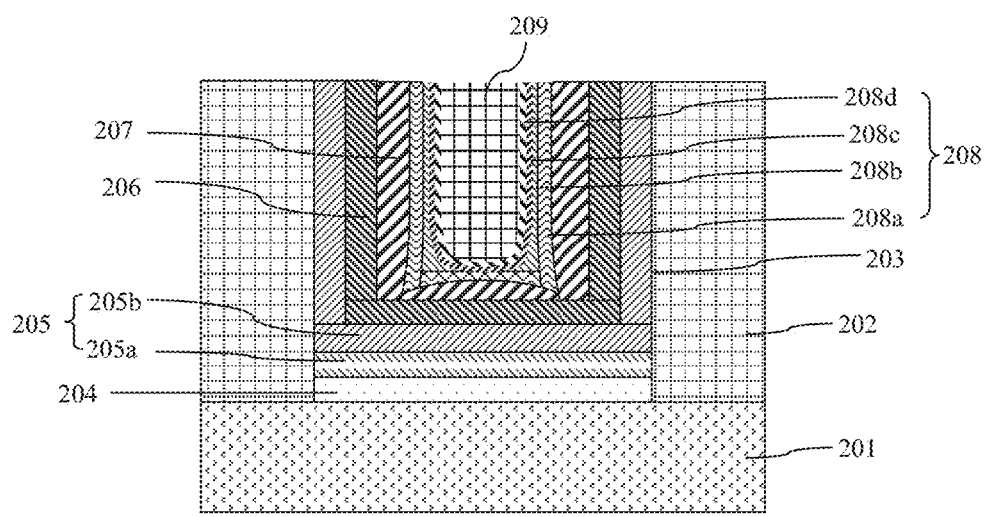

Step 6. Referring to FIG. 3E, a metal conductive material layer 209 is formed to completely fill the gate trench 203.

In this embodiment of the present application, the material of the metal conductive material layer 209 includes Al.

In order to solve the sharp corner defect at the corner of the gate trench 203 resulting from the hill profile of the N-type work function metal layer 207 deposited by means of the PVD process over the bottom surface of the gate trench 203, in this embodiment of the present application, before the formation of the third top barrier metal sublayer 208c and the fourth top barrier metal sublayer 208d, the first top barrier metal sublayer 208a is formed by means of the conformal growth process and the second top barrier metal sublayer 208b is formed by means of the PVD bombardment process. Due to the properties of the conformal growth, the first top barrier metal sublayer 208a can completely fill the sharp corner of the N-type work function metal layer 207 formed at the bottom corner of the gate trench 203. On that basis, the vertical bombardment effect of the PVD bombardment process causes the sputtering of the materials of the first top barrier metal sublayer 208a and the second top barrier metal sublayer 208b at the middle area on the bottom surface of the gate trench 203 to the corner of the gate trench 203, thereby making the opening profile of the second top barrier metal sublayer 208b in the gate trench 203 U-shaped. Such the U-shaped structure can prevent the finished top barrier metal layer 208 from forming a sharp corner at the corner of the gate trench 203 and presenting a relatively small thickness at the sharp corner. Therefore, the thickness of the top barrier metal layer 208 at the corner of the gate trench 203 can be increased, and the blocking capability of the top barrier metal layer 208 at the bottom corner of the gate trench 203 can be enhanced, reducing the metal material diffusion of the metal conductive material layer 209 of the metal gate, e.g., reducing aluminum diffusion of the metal gate into the P-type work function metal layer 206, and thereby improving the problem caused by the metal material diffusion of the metal gate.

In addition, the PVD bombardment process of the present application can increase the atomic density of the first top barrier metal sublayer 208a, enhancing the blocking capability of the first top barrier metal sublayer 208a and thereby further enhancing the blocking capability of the top barrier metal layer 208.

The present application is described in detail above by using specific embodiments, which, however, are not intended to limit the present application. Without departing from the principles of the present application, those skilled in the art can also make many modifications and improvements, which should also be regarded as the scope of protection of the present application.

What is claimed is:

1. A method for manufacturing a metal gate of a PMOS, comprising steps of:
    step 1, forming a P-type work function metal layer, the P-type work function metal layer being formed on a bottom surface and a side surface of a gate trench;
    step 2, depositing an N-type work function metal layer by means of a physical vapor deposition (PVD) process, the N-type work function metal layer being formed on a surface of the P-type work function metal layer, wherein over the bottom surface of the gate trench, the N-type work function metal layer has a hill profile composed of a thicker portion located at a middle area of the gate trench and a thinner portion located at the side surface of the gate trench, and the hill profile enables the N-type work function metal layer to have a sharp corner less than 90 degrees at a corner of the gate trench;
    step 3, forming a first top barrier metal sublayer on a surface of the N-type work function metal layer by means of a conformal growth process, wherein, due to properties of conformal growth, the first top barrier metal sublayer completely fills a sharp corner area of the N-type work function metal layer at the corner of the gate trench;
    step 4, growing a second top barrier metal sublayer by means of a PVD bombardment process, wherein the PVD bombardment process increases a vertical bias while growing the second top barrier metal sublayer, so as to achieve vertical bombardment on the first top barrier metal sublayer and the second top barrier metal sublayer, increasing atomic density of the first top barrier metal sublayer and causing sputtering of materials of the first top barrier metal sublayer and the second top barrier metal sublayer that are deposited at the middle area on the bottom surface of the gate trench to the corner of the gate trench, thereby increasing a thickness of a stack layer of the first top barrier metal sublayer and the second top barrier metal sublayer at the corner of the gate trench and making an opening profile of the second top barrier metal sublayer in the gate trench be U-shaped;
    step 5, sequentially forming a third top barrier metal sublayer and a fourth top barrier metal sublayer by means of a PVD process, wherein the first top barrier metal sublayer, the second top barrier metal sublayer, the third top barrier metal sublayer, and the fourth top barrier metal sublayer are stacked to form a top barrier metal layer; and
    step 6, forming a metal conductive material layer to completely fill the gate trench.

2. The method for manufacturing the metal gate of the PMOS according to claim 1, wherein in step 2, a material of the N-type work function metal layer comprises TiAl.

3. The method for manufacturing the metal gate of the PMOS according to claim 1, wherein in step 3, a material of the first top barrier metal sublayer comprises TiN or TaN.

4. The method for manufacturing the metal gate of the PMOS according to claim 3, wherein in step 3, the conformal growth process of the first top barrier metal sublayer is an atomic layer deposition (ALD) process.

5. The method for manufacturing the metal gate of the PMOS according to claim 3, wherein in step 4, a material of the second top barrier metal sublayer comprises Ti.

6. The method for manufacturing the metal gate of the PMOS according to claim 5, wherein in step 4, the vertical bias of the PVD bombardment process is 500 w-1200 w.

7. The method for manufacturing the metal gate of the PMOS according to claim 5, wherein in step 5, a material of the third top barrier metal sublayer comprises TiN.

8. The method for manufacturing the metal gate of the PMOS according to claim 7, wherein in step 5, a material of the fourth top barrier metal sublayer comprises Ti.

9. The method for manufacturing the metal gate of the PMOS according to claim 1, wherein a material of the metal conductive material layer comprises Al.

10. The method for manufacturing the metal gate of the PMOS according to claim 4, wherein a thickness of the first top barrier metal sublayer is 10 Å-30 Å.

11. The method for manufacturing the metal gate of the PMOS according to claim 5, wherein a thickness of the second top barrier metal sublayer is 10 Å-30 Å.

12. The method for manufacturing the metal gate of the PMOS according to claim 8, wherein a thickness of the stack layer of the third top barrier metal sublayer and the fourth top barrier metal sublayer is 90 Å-130 Å.

13. The method for manufacturing the metal gate of the PMOS according to claim 1, wherein in step 1, a material of the P-type work function metal layer comprises TiN.

14. The method for manufacturing the metal gate of the PMOS according to claim 1, wherein in step 1, the gate trench is formed by removing a dummy polysilicon gate.

15. The method for manufacturing the metal gate of the PMOS according to claim 14, wherein a gate dielectric layer and a bottom barrier metal layer are formed between a bottom of the P-type work function metal layer and a surface of a semiconductor substrate.

16. The method for manufacturing the metal gate of the PMOS according to claim 15, wherein the gate dielectric layer comprises an interface layer and a high dielectric constant layer stacked in sequence.

* * * * *